United States Patent
Lennon et al.

(10) Patent No.: US 8,273,659 B2
(45) Date of Patent: Sep. 25, 2012

(54) METHOD FOR PATTERNED ETCHING OF SELECTED MATERIAL

(75) Inventors: Alison Joan Lennon, Rozelle (AU); Stuart Ross Wenham, Kyle Bay (AU); Anita Wing Yi Ho-Baillie, Lane Cove (AU)

(73) Assignee: Newsouth Innovations PTY Limited, New South Wales (AU)

( * ) Notice: Subject to any disclaimer, the term of this patent is extended or adjusted under 35 U.S.C. 154(b) by 0 days.

(21) Appl. No.: 12/847,061

(22) Filed: Jul. 30, 2010

(65) Prior Publication Data
US 2011/0111599 A1    May 12, 2011

Related U.S. Application Data

(63) Continuation-in-part of application No. PCT/AU2009/000098, filed on Jan. 29, 2009.

(30) Foreign Application Priority Data

Feb. 1, 2008 (AU) .............................. 2008900477
Jun. 27, 2008 (AU) .............................. 2008903289
Nov. 21, 2008 (AU) .............................. 2008906040

(51) Int. Cl.
*H01L 21/302* (2006.01)
*H01L 21/311* (2006.01)
*H01L 21/461* (2006.01)

(52) U.S. Cl. . 438/689; 438/700; 438/745; 257/E21.245; 257/E21.246; 216/41; 216/83

(58) Field of Classification Search ............... 438/689, 438/700, 704, 723, 724, 745, 747, 756; 257/E21.245, E21.246, E21.219; 216/17, 216/39–41, 83, 88, 108
See application file for complete search history.

(56) References Cited

U.S. PATENT DOCUMENTS 7,358,184 B2 *  4/2008  Liu et al. ....................... 438/672
(Continued)

FOREIGN PATENT DOCUMENTS

| JP | 04-288649 | 10/1992 |
| WO | WO 01/47044 | 6/2001 |
| WO | WO 02/33740 | 4/2002 |

OTHER PUBLICATIONS

De Gans, et al., Polymer Relief Microstructures by Inkjet Etching, Journal of Materials Chemistry (2007) vol. 17, p. 3045-3050.

*Primary Examiner* — Hsien Ming Lee
(74) *Attorney, Agent, or Firm* — Vedder Price P.C.; Thomas J. Kowalski; Deborah L. Lu

(57) ABSTRACT

Surface processing in which the area to be processed is restricted to a predetermined pattern, can be achieved by: (a) providing a layer of a first reagent over a region of the surface to be processed which at least covers an area of the predetermined pattern; (b) providing one or more further reagents which are further reagents required for the processing of the surface; and (c) applying at least one of the further reagents over the region to be processed according to the predetermined pattern; such that the first reagent acts with the one or more of the further reagents to process the surface only in the area of the predetermined pattern. The process is particularly applicable to etching where an etchant having two or more components is used. In that case at least a first etchant component is applied over the surface and at least one further etchant component is applied in the predetermined pattern.

20 Claims, 12 Drawing Sheets

U.S. PATENT DOCUMENTS 7,384,862 B2 * 6/2008 Yamazaki .................. 438/610
7,416,989 B1 * 8/2008 Liu et al. .................. 438/706
7,431,860 B2 * 10/2008 Kawase .................. 216/83
2006/0076314 A1 4/2006 Sakurai

* cited by examiner

METHOD FOR PATTERNED ETCHING OF SELECTED MATERIAL

CROSS-REFERENCE TO RELATED APPLICATIONS

This application is a continuation-in-part application of international patent application Serial No. PCT/AU2009/000098 filed Jan. 29, 2009, which claims priority from AU Patent Application Serial No. 2008900477, filed on Feb. 1, 2008, AU Patent Application Serial No. 2008903289, filed on Jun. 27, 2008, and AU Patent Application Serial No. 2008906040, filed on Nov. 21, 2008.

Each of these applications and each of the documents cited in each of these applications ("application cited documents"), and each document referenced or cited in the application cited documents, either in the text or during the prosecution of those applications, as well as all arguments in support of patentability advanced during such prosecution, are hereby incorporated herein by reference. Various documents are also cited in this text ("application cited documents"). Each of the application cited documents, and each document cited or referenced in the application cited documents, is hereby incorporated herein by reference.

FIELD OF THE INVENTION

The present invention relates generally to the field of device fabrication and, in particular, to the patterned etching of dielectric layers of semiconductor devices, such as silicon solar cell devices.

BACKGROUND OF THE INVENTION

Semiconductor device fabrication typically involves extensive use of patterned etching of both semiconductor and dielectric materials. In particular, the formation of patterns of openings in silicon dioxide dielectric layers of silicon devices is widely used because of the passivating and optical effects of silicon dioxide on silicon surfaces. Patterned etching of silicon dioxide layers can be used to facilitate localised diffusions and metal contacts to underlying silicon, or in other cases, to provide a mask for etching the underlying silicon. Typically, the patterned etching of dielectric layers, such as silicon dioxide, has been achieved using photolithography or scribing.

However, photolithography requires costly equipment (e.g., mask aligners, mask writers), clean room environments, and generally many time-consuming steps. Changes in patterns require new mask sets. A typical photolithographic process for the formation of a pattern of openings in a dielectric typically requires deposition of a resist layer over the dielectric layer (usually by spin-coating), appropriately aligning a prepared mask over the resist layer, exposing the resist through the mask to UV radiation and then developing the exposed resist to form a pattern of openings in the resist. The resist with a pattern of openings is then used as a mask against etchants in wet etching and physical etching (e.g. ion etching) applications. Etching fluids for silicon dioxide typically comprise aqueous hydrogen fluoride or a buffered oxide etching solution, both of which are highly corrosive. The device is then rinsed to remove traces of the etchant, and finally the resist layer is removed to leave a patterned dielectric layer on the device.

More recently, inkjet methods of patterning a resist layer have been described. These methods remove the need to use photolithography for the patterning step, using instead an inkjet device to deposit a solution, which either creates openings or permeable regions in the resist layer, at predetermined locations. The thus-patterned resist layer can then be used to mask the underlying dielectric layer while the printed pattern provides a path for the etching of the dielectric during immersion in an etching solution. These inkjet methods of patterning a resist provide a potential low cost alternative to photolithography. Changes in the etching pattern can be realised quickly by changes in a digital image pattern used by the inkjet printer. However, like the photolithographic methods, they still involve many time-consuming steps and require the use of large quantities of chemicals, in particular resins for resist and corrosive etching solutions. Because of the need to use large quantities of corrosive solutions for the wet etching step, significant safety controls must also be adhered to in production environments. Therefore, advances which can reduce the number of processing steps and/or the amount of expensive and corrosive chemicals used in the patterning step are desirable. Furthermore, advances which minimise the risks to human operators when performing etching processes and reduce the amount of hazardous waste are also desirable.

In this specification, where concentrations are given as a percentage (%) this is intended to indicate a ratio of weights (w/w) unless otherwise indicated.

Citation or identification of any document in this application is not an admission that such document is available as prior art to the present invention.

SUMMARY OF THE INVENTION

A method of processing a surface is provided, wherein the process is restricted to an area of the surface defined by a predetermined pattern, the method comprising:
 (a) providing a surfactant as a layer or a component of a layer extending over a region of the surface to be processed which at least covers an area of the predetermined pattern;
 (b) providing a deposition composition comprising at least one component required for the processing of the surface; and
 (c) applying the deposit composition over the region to be processed according to the predetermined pattern;
whereby the surfactant assists the wetting of the surface to be processed by the deposition composition in the area of the predetermined pattern.

A further method of processing a surface is provided, wherein the process is restricted to an area of the surface defined by a predetermined pattern, the method comprising:
 (a) providing at least a first component required for the processing of the surface as a layer extending over a region of the surface to be processed which at least covers an area of the predetermined pattern;
 (b) providing at least one deposition composition comprising one or more further components required for the processing of the surface; and
 (c) applying the at least one deposition composition over the region to be processed according to the predetermined pattern;
whereby the first component required for processing the surface acts with the one or more further components required for processing of the surface to process the surface only in the area of the predetermined pattern.

The layer comprising the first component, extending over the region of the surface to be processed may be in a gas, liquid, solid phase or may be a gel. If the first component is in a liquid or gaseous state a porous material may be applied to the surface to be processed and the first component constrained within the porous layer.

When the first component is a solid, it may be applied by applying a solution containing the first component and evaporating a solvent of the solution to deposit the first component on the surface. When the first component is a liquid or a gel, or if a solution to be evaporated is being applied, the method of applying the first component may comprise a flow on method, a spin-on method, a spray coating method or an inkjet printing method. The application method may also involve applying a liquid by one of the above methods at an elevated temperature and then hardening the layer by cooling.

The solution containing the first component may contain an additive that can act as a surfactant during the processing of the surface. The solution containing the first component may also contain an additive that can reduce the critical surface tension of the surface layer.

The present method may be advantageously used in processes where one of the process materials is dangerous or otherwise difficult to handle. When the process material created by the mixture of the first and second components has a physical characteristic making it dangerous and difficult to handle, such as by being highly corrosive, toxic viscous, or sticky and at least one component does not exhibit the respective characteristic or exhibits the characteristic to a lesser degree, the less troublesome component may form the second component in the present method and may conveniently be applied in a patterned manner using a device that can deposit the fluid as a pattern of individual drops (e.g., a drop-on-demand inkjet printer).

The present method may be used for various processes including patterned layer forming, patterned transformation of a surface such as by doping, dying, or chemically modifying the surface, or patterned etching of the surface. An example of patterned layer forming would be the formation of an epoxy, polyester or polyurethane patterned layer by applying the respective unlinked resin as the first layer and applying the cross-linker as the second component (e.g. by inkjet printing). The unprocessed resin can then be washed off with a suitable solvent to leave the patterned layer.

In a particularly preferred application of the method, the surface is processed by etching according to the predetermined pattern. The surface to be etched will be a predetermined material and the etchant formed by the combination of the first and second process components will generally be a material specific etchant although not always so.

The forming of the surface layer over the predetermined material will be in accordance with one of the techniques mentioned above and the surface layer will comprise at least a first component required for etching the predetermined material. The deposition composition will comprising at least a second component required for etching the predetermined material, and is applied to the surface layer according to the predetermined pattern. When combined on the surface, the surface layer comprising the first component acts with the deposition composition comprising the second component to etch the region of the predetermined material to be processed according to the predetermined pattern.

For etching, the predetermined material may be selected from the group comprising dielectrics including but not limited to silicon dioxide, silicon nitride, silicon carbide, TCOs, glass, organic resins and other polymers including pattern mask materials, or from the group of metals including but not limited to aluminium, copper, silver, gold, tin and lead or alloys thereof and the broad group of semiconductor materials including but not limited to silicon, germanium, gallium-arsenide, indium phosphide, or alloys such as silicon-germanium or aluminium-gallium-arsenid, indium-selenide, galium-selenide, cadmium-telluride or copper indium gallium selenide (CIGS).

Preferably the surface layer may be a polymer layer and for etching applications.

Where the predetermined material is silicon dioxide, the polymer layer may be acidic and preferably the polymer layer will be a water-soluble layer containing an acidic polymer. The polymer may, for example, contain one of polyacrylic acid, polystyrene sulphate, an acidic polythiophene derivative, an acidic polyaniline derivative, or a water soluble phenolic resin. Also, if the predetermined material is silicon dioxide, the deposition composition will preferably contain a source of fluoride ions. The source of fluoride ions may be provided, for example, by one or more of: ammonium fluoride, a tetra alkyl ammonium fluoride, sodium fluoride, and lithium fluoride.

The present method may, for example be used to etch openings in a dielectric layer of a silicon solar cell device. Such openings may be used in the formation of metal contacts to the silicon solar cell device. Preferably in applications of the present method, the deposition compound will be delivered in a patterned manner. One convenient and preferred method of delivering droplets of the deposit composition is by using a device that can deposit the fluid as a pattern of individual drops (e.g., a drop-on-demand inkjet printer).

After processing applications according to the present method, a final step may be required of removing from the surface, any unwanted excess surface layer material remaining outside the predetermined pattern area.

Accordingly, it is an object of the invention to not encompass within the invention any previously known product, process of making the product, or method of using the product such that Applicants reserve the right and hereby disclose a disclaimer of any previously known product, process, or method. It is further noted that the invention does not intend to encompass within the scope of the invention any product, process, or making of the product or method of using the product, which does not meet the written description and enablement requirements of the USPTO (35 U.S.C. §112, first paragraph) or the EPO (Article 83 of the EPC), such that Applicants reserve the right and hereby disclose a disclaimer of any previously described product, process of making the product, or method of using the product.

It is noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the invention.

These and other embodiments are disclosed or are obvious from and encompassed by, the following Detailed Description.

BRIEF DESCRIPTION OF THE DRAWINGS

The following detailed description, given by way of example, but not intended to limit the invention solely to the specific embodiments described, may best be understood in conjunction with the accompanying drawings, in which.

DETAILED DESCRIPTION OF EMBODIMENTS

Figure 1A:
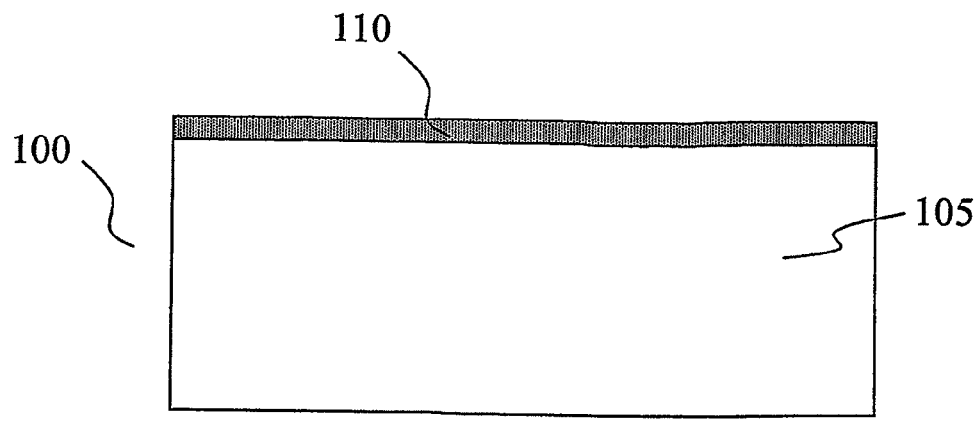
FIG. 1A is a schematic diagram showing, in cross-section, a substrate with a layer, such as silicon dioxide, to be etched.

A method for etching selected material, such as silicon dioxide dielectric layers, is described below. The method does not require a masking or resist layer and is safer than existing etching methods in that the corrosive etchant is only formed in-situ on the device surface to be etched. Furthermore, because the etchant is formed only at the locations to be etched, the method requires small amounts of chemicals and produces significantly less hazardous chemical waste. The method does not require any resist chemicals and only uses small quantities of etching precursor materials. The hazardous hydrogen fluoride waste of existing silicon dioxide wet etching methods is a concern for manufacturing processes around the world. Although the method is described with respect to the patterned etching of silicon dioxide, it should be clear to those skilled in the art of semiconductor device fabrication that the disclosed method can be applied to the etching of other materials including metals, other dielectrics and semiconductors.

The method of etching reduces the use of corrosive chemicals by bringing together at least two etching components on the surface location of a device where etching is required. Preferably, the individual etching components are inactive and only react to form compound(s) which are capable of etching the underlying device surface when they come into contact with each other. Preferably, at least one component is provided by a surface layer which is formed over the material to be etched. One or more further components are provided in fluids which are applied to the surface layer according to a predetermined pattern. Preferably, the fluid(s) containing the one or more further components are applied in a patterned manner using a device that can deposit the fluid as a pattern of individual drops (e.g., a drop-on-demand inkjet printer). Alternatively, devices capable of generating a continuous jet or stream according to a predetermined pattern, such as electrohydrodynamic jet printers, aerosol jet printers or continuous inkjet printers, can be used. The device, or substrate being etched, is then rinsed in water to remove the surface layer and the etching products, thus exposing a pattern of etched openings in the device material.

Preferably, the component provided by the surface layer provides a chemical component, such as a source of acidity, for the etching process. Alternatively, the surface layer can provide an essential constraining framework or porous network required for the localised activation of the etching process. The constraining framework may consist of a necessary physical component and/or one or more compounds that may catalyse the etching process. It can also provide a low-energy surface that can minimise the spread, and therefore action, of a deposited fluid.

Known methods for wet etching of silicon dioxide involve exposing the silicon dioxide surface to a solution containing hydrogen fluoride (HF). The etch rate depends on the etching solution composition, type of oxide and temperature. For example, (concentrated) 49% HF solution will etch a thermal silicon dioxide layer at a rate of 2300 nm/min at room temperature. Etching of silicon dioxide can also be achieved using buffered oxide etching solutions. These solutions are mixtures of ammonium fluoride and hydrogen fluoride with the ammonium ions maintaining the etch solution at a constant pH thus resulting in a constant etch rate as etching proceeds. Different etch rates have been reported for different ratios of ammonium fluoride and hydrogen fluoride. For example, a 5:1 buffered oxide etch (which is mixed from 5 parts of 40% NH$_4$F and 1 part 49% HF) has an etch rate of ~100 nm/min. The overall silicon dioxide etching reaction occurring in a buffered oxide etch is:

$$SiO_2(s) + 4HF(aq) + 2NH_4F(aq) \rightarrow (NH_4)_2SiF_6(aq) + 2H_2O \quad (1)$$

The etch product, ammonium fluorosilicate, has a high solubility of 250 g L$^{-1}$ at 20° C. and low ammonium fluoride concentrations which means that it can be readily rinsed away without forming solid precipitates. High concentrations of ammonium fluoride, in the etching solution, can reduce the solubility of the ammonium fluorosilicate. For example, the solubility of the ammonium fluorosilicate is reduced to 7-10 g L$^{-1}$ at 20° C. if the ammonium fluoride concentration is 20% (w/v). A lower pH, or more acidic environment, can slightly increase the solubility of ammonium fluorosilicate, however this effect on the fluorosilicate solubility is not as marked as the effect of increased ammonium fluoride concentration. Therefore, there is a limit to the desirable concentration of ammonium fluoride in an etching system involving the formation of ammonium fluorosilicate.

Many variations of these basic silicon dioxide etching recipes exist in the prior art. Some variations are designed to increase the specificity of the etch to different types of oxide and to preferentially etch silicon dioxide over other metals that may be present. For example, a pad-etch solution (e.g., Pad Etch 4 from Ashland) is formulated to etch silicon dioxide with much slower etching of aluminium pads on circuit boards. In this etching system (11-15% $NH_4F$+30-34% $CH_3COOH$+47-51% $H_2O$+4-8% propylene glycol+surfactant), the acetic acid is the acidic source which, in combination with fluoride ion, forms the reactive etching species.

The current method of etching silicon dioxide relies on providing the fluoride ion and the acid separately and bringing these two essential precursor components together at the desired etching location. Preferably, the acid component is provided as acidic protons in a water-soluble acidic polymer film which is formed as a surface layer over the (dielectric) surface to be etched. The polymer film is preferably formed over the surface to be etched by spin-coating, however other polymer coating methods can also be used. In alternative arrangements, the surface layer can comprise materials other than polymers (e.g., inorganic materials deposited by methods such as evaporation, sputtering or chemical or plasma vapour deposition.

The fluoride ion is preferably formulated in an aqueous solution which is then deposited in a pattterned manner at the locations where etching is required. The solution can be deposited drop-wise using, for example, drop-on-demand inkjet printing, or as a continuous fluid stream using, for example, continuous inkjet printing, hydrodynamic or aerosol jet printing. For the continuous stream deposition methods, techniques such as shuttering must be employed when etching patterns necessitate the termination of the jet. In deposition methods, such as aerosol jet printing, the solution being deposited can be processed into an aerosol before being deposited on the polymer film. The term deposition fluid will be subsequently used to refer to solutions or aerosols which are deposited onto the polymer film (surface layer).

At locations where the deposition fluid contacts the polymer film, the polymer is locally dissolved and the fluoride ions abstract acidic protons from the polymer to form hydrogen fluoride. The formed hydrogen fluoride, dissolved in the fluid at the deposition location, can then etch the exposed silicon oxide. This means that corrosive etching solutions, which contain hydrogen fluoride, are not directly handled. Although, fluoride-containing solutions are classified as toxic they are more safely handled than hydrogen fluoride solutions. In addition, the method of the preferred arrangement uses only small quantities of fluoride ion and the fluoride ion is formulated in solutions of reasonably dilute concentration. Furthermore, the deposition method used by the preferred arrangement for the fluoride-containing solution minimises operator contact with the solution. Once loaded in the fluid reservoir of, for example, an inkjet printer, the solution does not require further handling.

Direct deposition of the etching fluids containing hydrogen fluoride is difficult to achieve because few printheads, or jetting devices more generally, can tolerate the corrosive nature of the fluid. The hydrogen fluoride will attack and corrode most ceramic, stainless steel, and silicon-based printheads. The silicon-based printheads cannot be used because they typically contain silicon dioxide components which are etched by the hydrogen fluoride. In addition to causing long-term corrosion of the printhead, the etch products quickly cause intermittent nozzle blockages which make it difficult to reliably jet the solution. Furthermore, few operators would consider it safe to deposit hydrogen fluoride-containing solutions via inkjet, or other fluid deposition methods, because of the risk of operator contact in the event of fluid leaks. This is not a problem for the current method, because the fluoride-containing solution is not corrosive. This means the solution can be jetted using silicon and ceramic printheads.

Various aspects of the preferred arrangement will now be described with reference to the fabrication of a pattern of openings in a silicon dioxide dielectric layer. The thus-formed openings are preferably used to form metal contacts to a semiconductor device, such as a silicon solar cell. They can also be used as openings for diffusion or etching the underlying silicon. As such, the patterning of silicon dioxide dielectric layers has widespread application in the general fabrication of semiconductor and other micro-electro-mechanical systems (MEMS) devices. The general method can also be applied to the etching of other materials, where an etchant can be formed in situ from at least one surface layer and one or more deposited fluids.

The method of etching openings in a dielectric layer of a semiconductor device, such as the solar cell, will now be described in detail with reference to FIG. 1A to FIG. 1E. The substrate for the method of the preferred arrangement 100 comprises a silicon wafer 105 with a dielectric silicon dioxide layer 110. In the preferred arrangement, the wafer can be a p-type or n-type silicon wafer. The surface can be diffused with dopants of opposite polarity such as phosphorus or boron or aluminium to create an emitter. The thickness of the wafer can range from 150-450 μm. Preferably, a layer of thermally grown silicon dioxide 110 ranging from 15 to 400 nm thickness is formed over the surface. In alternative arrangements, other dielectrics such as silicon nitride can be used. Other substrates such as glass or plastic material may also be used with silicon being deposited using various techniques. Such structures can result in thin film solar cell devices.

Other possible substrates include silicon-on-insulator substrates which are frequently used as components in the fabrication of devices such as silicon inkjet printheads, microfluidic devices and other MEMS devices.

Figure 1B:
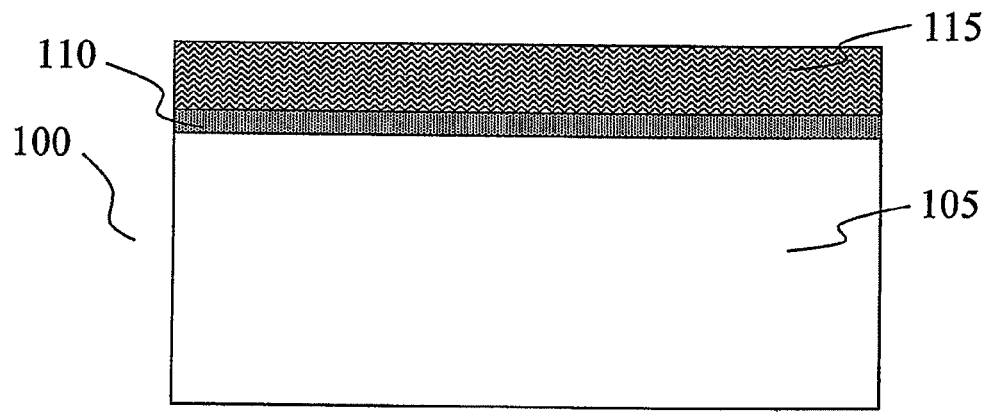
FIG. 1B is a schematic diagram showing the substrate coated with a surface acidic polymer layer.
Figure 2:
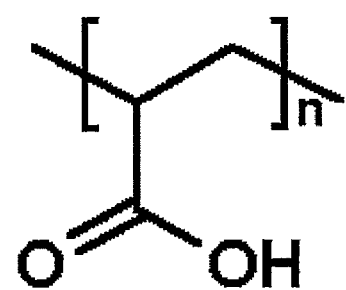
FIG. 2 shows the structure of an example acidic polymer, polyacrylic acid.

A water-soluble acidic polymer film 115 is then spin-coated over the surface of the silicon dioxide dielectric layer 110 as shown in FIG. 1B. Preferably, the film is spin-coated for 30 s from a solution of 25% (w/v) polyacrylic acid (PAA) in water at a spin speed of 7500 rpm. Polyacrylic acid is a homopolymer of acrylic acid having a molecular weight of approximately 90,000 g mol$^{-1}$. The PAA monomer unit is a source of acidic protons as shown by the chemical structure in FIG. 2. The pKa of PAA is ~4.3.

The spin-coated polymer film is air dried for ~3 hours resulting in a film ~2.5 μm thick. The solid content of the solution used to form the acidic polymer film can be varied from 5% to 30% without significantly affecting the polymer film quality, however preferably the solid content is between 25% and 30%. Use of a lower solid content and/or faster spinning speeds result in a thinner film. Thinner films are suitable when only shallow etched opening are required. Thicker films, obtained by spinning at lower speeds, can be used for etching deeper structures. The substrate 100 with the polymer film 115 can be stored under nitrogen until required for etching. Nitrogen is used in order to minimise uneven humidification of the polymer film.

In alternative arrangements, other water-soluble polymers or resins containing acidic groups (e.g., acidic polythiophene or polyaniline derivatives, polystyrene sulfonate, polyester or phenolic resins) can also be used. It is also possible to use polymer mixtures or blends to form the acidic film. For example, PAA can be blended with other water soluble polymers such as polyvinyl alcohol (PVA) in PAA:PVA ratios ranging from 1:1 to 1:4 depending on the extent of etching required. Polyacrylic acid can also be blended with less hydrophilic polymers, such as polymethacrylic acid to result in a dried film with a lower critical surface tension. This variation can be advantageous when smaller etched features are required because the deposited droplets spread less on the more hydrophobic surface. Copolymers of the acidic polymer (e.g., PAA) can also be used to form the polymer film. The use of copolymers or polymer blends for forming the thin film is a way in which the acidity of the formed film can be controlled. Furthermore, polymer films can contain additives which can either directly provide further acidic groups or indirectly enhance the acidity of the film. These additives can be either dissolved or dispersed (e.g., nanoparticles) in the solution used to form the acidic polymer layer. These additives can also be used to modify the surface properties of the polymer film.

In yet a further variation, the polymer film may also contain surfactants. Preferably fluorsurfactants (e.g., Novec 4200 from 3M) are used and in concentrations <1.0%. These surfactants can improve the evenness of the resulting etching by enabling the deposited solution to more evenly wet the surface to be etched. The added surfactant can also actively reduce the critical surface tension of the polymer film thus enabling smaller etched features to be obtained. Other fluoropolymer additives, such as FC-4432 (also from 3M) can also be added to the film, specifically to reduce the critical surface tension of the final polymer surface. However, the longer chain fluoropolymers are less effective wetting agents than the smaller surfactant preparations like Novec 4200. Other surfactants or surface tension modifying agents, which are compatible with fluoride ion chemistry, can also be used.

Etching of the silicon dioxide is preferably achieved by deposition of droplets of a solution, containing a source of fluoride ion, by an inkjet device. Preferably, the inkjet device is digitally controlled and can deposit droplets of the solution at locations on the surface according to a predetermined image pattern.

Figure 1C:
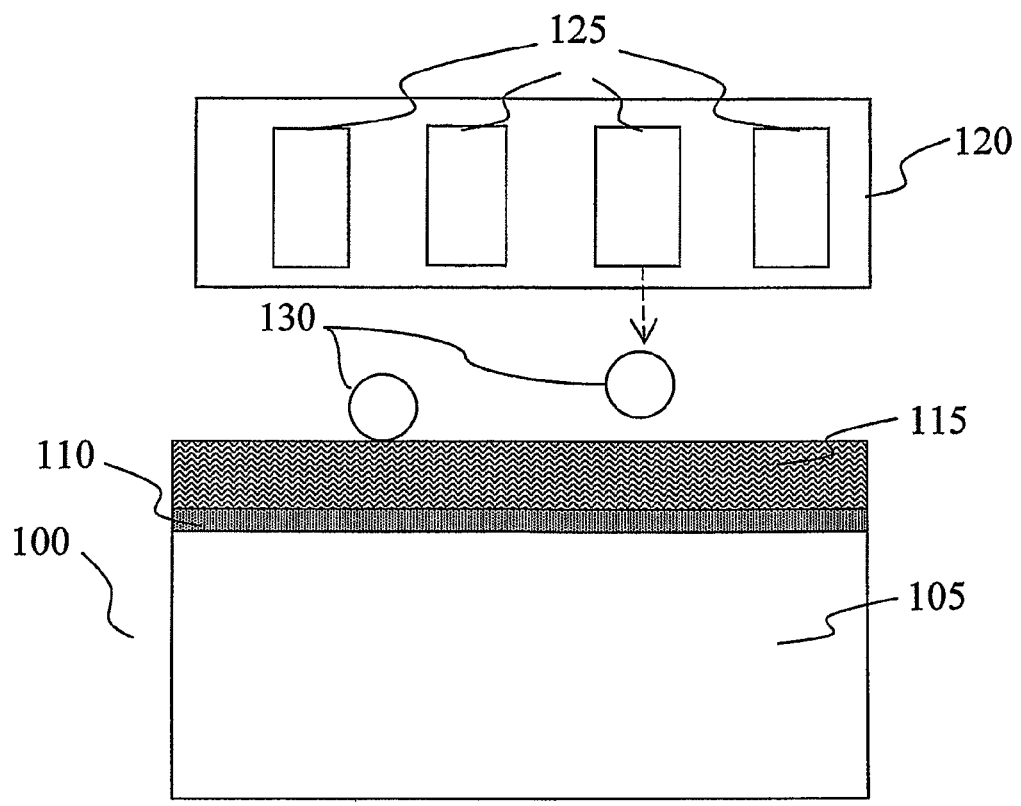
FIG. 1C is a schematic diagram showing the deposition of two drops of a solution containing an etching component onto the acidic polymer layer.
Figure 1D:
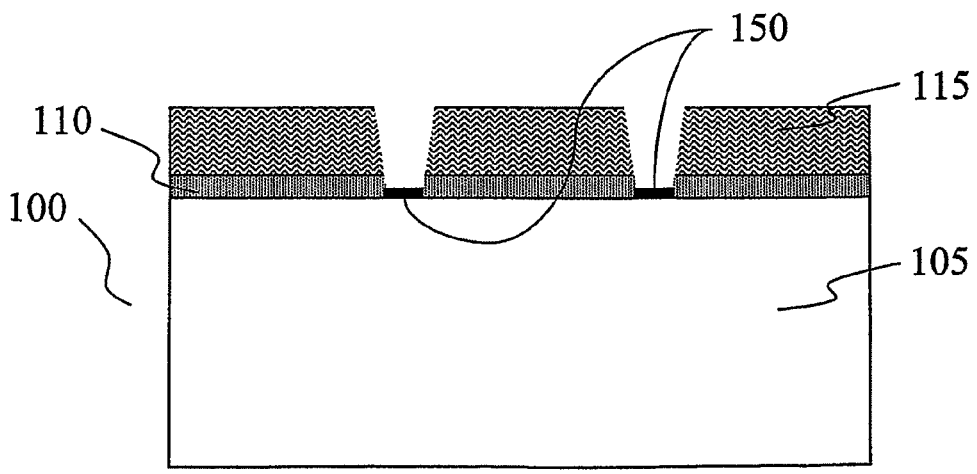
FIG. 1D is a schematic diagram showing the formation of etched openings in the substrate.

The inkjet device 120, depicted in FIG. 1C, contains one or more printheads 125 which can eject droplets of a solution 130 from an array of nozzles. Firing of individual nozzles can be under thermal or piezoelectric control. The solution being jetted can be stored in a cartridge on or close to the printhead or in a reservoir located more distant to the printhead. In the preferred arrangement, the printhead of the inkjet device 120 scans across the polymer surface depositing solution as required in the scan. The substrate 100 is located on a platen which moves relative to the printhead in an axis perpendicular to the scan axis. However, in alternative arrangements the platen can be maintained stationary as the printhead scans in both directions, or the printhead can be maintained stationary as the substrate (i.e., the substrate 100) is moved in both directions. Preferably, the platen and thus the substrate 100 can be heated while printing is occurring.

In the preferred arrangement, a piezo-electrically controlled silicon printhead, manufactured by FUJIFILM Dimatix, is used to deposit the fluoride-containing solution. The printhead is incorporated in a cartridge and has 16 nozzles linearly spaced at 254 microns with a drop size of either 1 or 10 picoliters. Preferably, cartridges having the smaller nominal 1 pL drop sizes are used. However, if larger etched features are required then the 10 pL cartridges can be advantageous because fewer droplets are required to be deposited for a given volume of silicon dioxide to be etched. For each of the 1 and 10 pL cartridges, the actual volume deposited per droplet depends on the firing conditions (e.g., voltage applied to the nozzle) and properties of the solution being deposited (e.g., surface tension and viscosity). Printheads able to deposit other droplet volumes can also be used. In general, smaller droplet volumes result in smaller etched openings, however it is typically necessary to print more layers for a comparable etch depth.

The firing of individual nozzles is under software control thus enabling programmed deposition of droplets according to a predetermined pattern. The pattern can be provided using standard image formats such as bitmap files. Furthermore, in order to provide a sufficient quantity of the deposition fluid to etch the surface of the substrate 100 to the required depth, the software of the inkjet device used by the preferred arrangement enables multiple layers of a selected pattern to be printed at a selected location. The layers are printed one after another with only very short delays between the successive layers. Optionally, a delay can be inserted between the printing of successive layers. In a further alternative arrangement, rather than printing multiple layers of a pattern, multiple droplets of the deposition solution can be deposited at each location before the printhead and/or platen are moved to the next deposition location. This approach has the advantage that it does not rely on good alignment between the printing of multiple layers, however it can result in uneven etching of openings (e.g., grooves).

It should be appreciated that the requirement to print multiple layers of the fluoride-containing solution arises from the etching stoichiometry. Six fluoride ions are required for every etched silicon atom in the silicon dioxide crystal layer. If it is assumed that all the fluoride is consumed in the etching process and that the polymer film provides an excess of acidic groups, then it is possible to calculate the total minimum volume of a fluoride-containing deposition solution required to etch an opening of defined size.

The inkjet device, used by the preferred arrangement, jets solutions optimally when the viscosity is between 10 and 14 cP and the surface tension is between 28 and 32 mN/m. However, it is possible to jet solutions having viscosities as low as 2 cP using the device. This is achieved by appropriately tuning the waveform applied to the piezoelectric nozzles. Variations in surface tension are harder, though also possible, to accommodate. If a solution's surface tension is too high (e.g., ~70 mN/m as for deionised water), it is difficult to prime the printhead (i.e., no solution can be initially ejected from the nozzles). On the other hand, if the solution's surface tension is too low then the surface which contains the nozzle orifices (nozzle plate) typically becomes flooded with the jetting solution thus causing erratic placement of droplets on the polymer surface. The nozzle plate of the inkjet device used by the preferred arrangement has a polymer non-wetting surface, however the jetting of low-surface-tension fluids can still result in significant wetted areas on that surface and thus erratic firing.

Preferably the fluoride ion in the deposition solution is provided as an aqueous solution of ammonium fluoride, with the ammonium fluoride concentration being in the range of 10% to 15% (w/v), and more preferably ~11% (w/v). Other sources of fluoride ion can also be used (e.g., sodium fluoride, lithium fluoride, tetra alkyl ammonium fluoride compounds), however the solubility of the final etch product needs to be considered carefully. For example, the solubility of sodium fluorosilicate (~40 mg $L^{-1}$ at 20° C.) is much less than that of ammonium fluorosilicate. This means that more dilute fluoride solutions must be jetted to ensure that the etching product does not precipitate on the surface to be etched thus preventing further etching of an opening. Deposition of more dilute fluoride solution necessitates larger volumes of the deposition solution to be jetted (i.e., more layers of the pattern must be printed).

In the preferred arrangement, 20% (v/v) polyethylene glycol, having a molecular weight of 400 g $mol^{-1}$, (PEG 400) is also added to the jetting solution to increase the viscosity to ~4 cP and thus improve the jetting performance. In alternate arrangements, the PEG 400 can be omitted from the deposition solution, or included at a lower concentration in the solution. However, lower pulse voltages, slower pulse rise times and lower jetting frequencies are required in order to reliably jet the lower-viscosity solution. In other arrangements, the PEG 400 can be replaced by other compounds which increase the solution's viscosity (e.g., glycerol, basic water-soluble polymeric compounds such as polyvinyl pyrrolidone, or other glycols).

The pH of the deposition solution is increased to between 8-10 and more preferably 8 by addition of ammonium hydroxide. A high pH is required in order to ensure that the concentration of the reactive etching species, HF and $HF_2^-$, in the deposition solution are minimised. In ammonium fluoride solutions, at pH values greater than 7, the concentration of both these species is effectively zero resulting in no etching of silicon dioxide, thus protecting any silicon dioxide components in the printheads. If the solution is too alkaline (e.g., pH>11), some etching of the silicon printhead may occur.

The surface tension of the resulting deposition solution of the preferred arrangement is ~46 mN/m at 28° C. Although this exceeds the optimal surface tension range for the FUJIFILM™ Dimatix™ printheads used, the jetting waveform can be adjusted to accommodate the increased surface tension. The increased surface tension advantageously results in less spreading of the solution when it contacts a PAA surface, which has a critical surface tension of ~44 mN/m. Reductions in the surface tension of the deposition solution result in more spreading of the deposited droplets and thus larger etched features.

Finally, the temperature of the deposition solution is maintained at 28° C. The use of lower temperatures can also be used, however typically the surface tension of a solution will increase at lower temperatures thus making it more difficult to jet the solution.

The jetting of a solution having a moderately high surface tension onto a polymer surface containing a surfactant, such as Novec 4200 (from 3M) is a useful strategy to achieve small, cleanly etched features. This strategy is possible because of the ability to tune the firing waveform used by the FUJIFILM™ Dimatix™ printheads.

Figure 3:
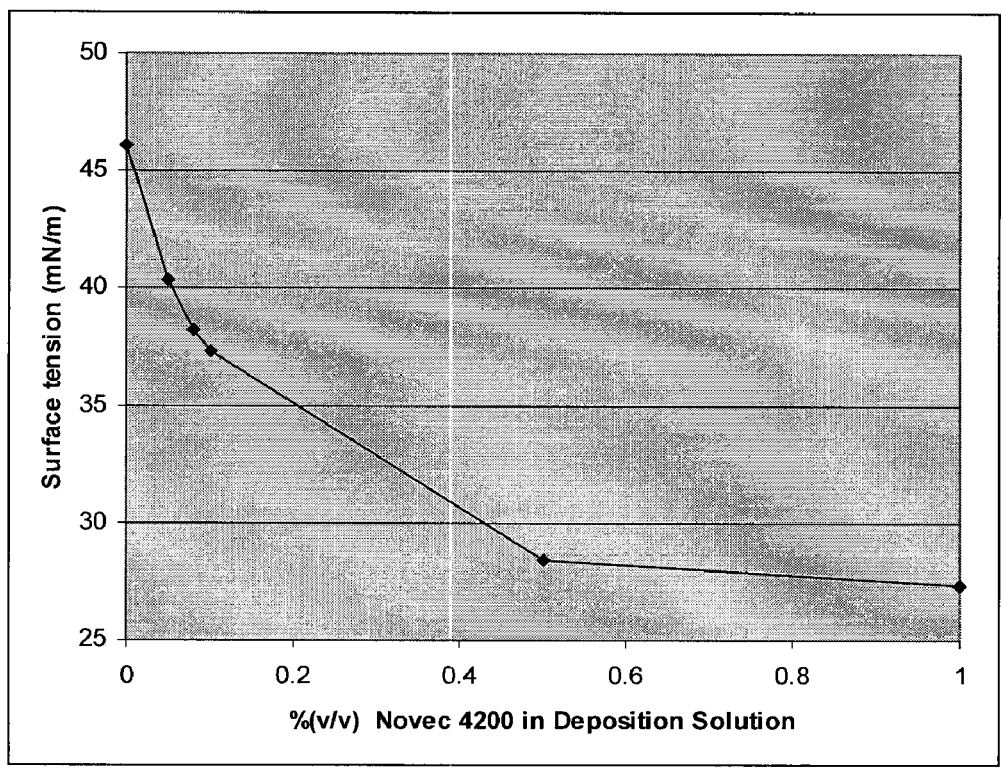
FIG. 3 shows a graph illustrating how the surface tension of the deposition solution varies with the percentage of added Novec 4200 surfactant in one example.

In alternative arrangements, fluorinated surfactants, such as Novec 4200 (from 3M), can be added to the deposition solution. These surfactants can effectively reduce the surface tension to values which are in the optimal range for the FUJIFILM Dimatix printheads (see FIG. 3). For the Novec 4200, a concentration of between 0.3% and 0.5% (v/v) will reduce the surface tension of the deposition solution to optimum surface tension range of 28-32 mN/m and thus enable it to be reliably jetted. Other surfactants, which are compatible with solutions containing fluoride ions can also be used.

Furthermore, other additives that can vary the surface tension can also be used. For example, addition of glycols such as propylene glycol can also readily reduce the surface tension to the optimal range for the FUJIFILM™ Dimatix™ printheads. In other arrangements, which use different printheads, the surface tension and viscosity may need to be varied to meet the operating requirements of the printheads.

In the preferred arrangement, the platen and thus the substrate 100 is heated during the jetting of the deposition solution. Heating of the platen, results in some of the solvent of the deposition solution being evaporated during jetting causing smaller wetted areas and therefore smaller etched openings. Preferably, for etching groove openings the platen is heated to 45° C. Heating the platen to temperatures >45° c. can result in smaller etched features and faster etching. However, at least for groove openings the etching can be less even. This is, most likely, due to the reduced aqueous environment at the active etch surface and possibly also precipitation of the etch product, ammonium fluorosilicate.

Excessive heating of the platen to temperatures of ~100° C. should be avoided as this can result in the vaporisation of the formed HF. The boiling point of 49% HF is 106° C., however the boiling point decreases as the HF becomes more concentrated. For example, it reduces to 66° C. at 70% and to 19.5° C. when all water is removed (i.e., anhydrous HF). In the preferred arrangement, the printing compartment of the inkjet device is vented to ensure removal of any potential corrosive HF vapour that may form during the deposition process.

Figure 1E:
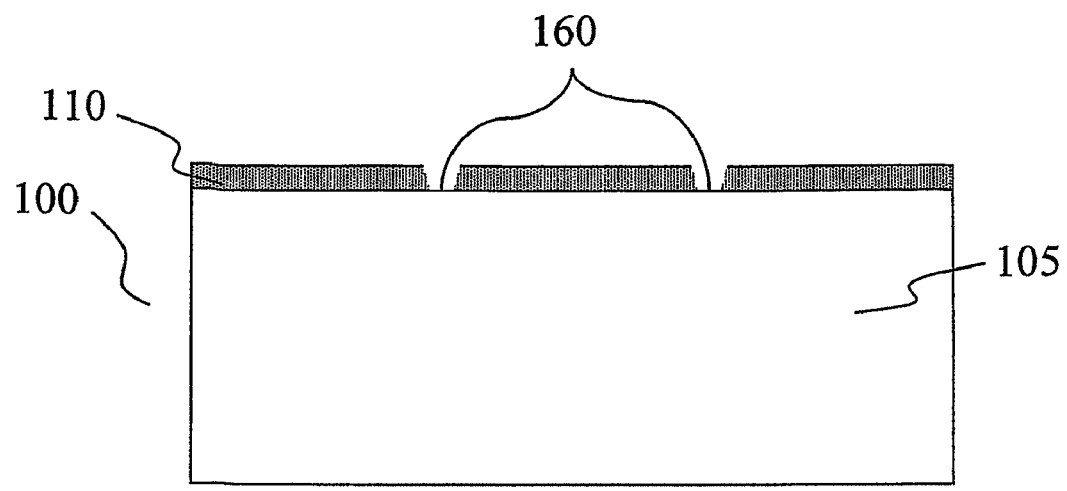
FIG. 1E is a schematic diagram showing the substrate after the etch residue and acidic polymer layer have been removed.

Returning now to FIG. 1D, the substrate 100 is removed from the platen of the inkjet device and immersed in flowing deionised water for 5-10 minutes. This final rinse step removes both etching product trapped in the openings 150 and the water-soluble polymer film to form the final etched substrate 100 with openings 160 as shown in FIG. 1E. Unlike existing wet etching processes, the quantity of fluorinated waste during this rinse step is very small, being only that fluoride which has been deposited by the inkjet printer. This means that the waste is very dilute and not very hazardous.

In fact, in many applications the fluoride concentration in the waste (rinse) water may be less than that required by regulatory authorities (in the order of 2-20 ppm depending on the regulation imposed). Because the exact quantity of fluoride can be calculated for any process, the volume of water required to appropriately dilute the fluoride to the allowed discharge levels can be used to rinse the device or substrate being etched. The possibility of not requiring to treat the fluoride waste for the described method, is a significant advantage over existing wet chemistry methods of etching dielectrics such as silicon dioxide.

Figure 4:
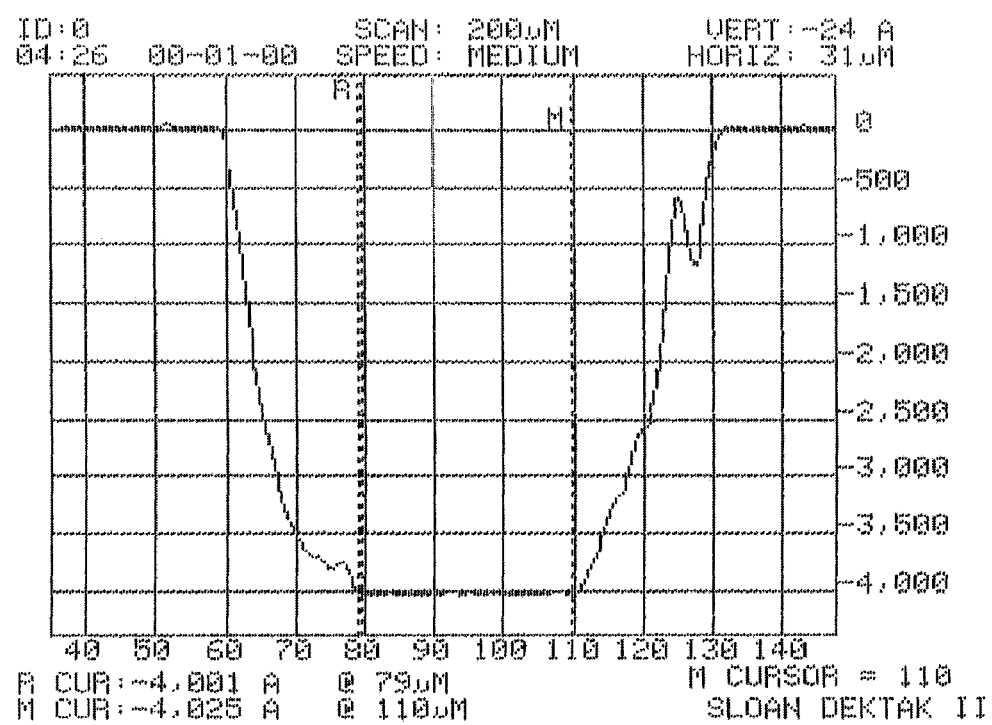
FIG. 4 shows a Dektak profile of a groove, etched in a thermally grown silicon dioxide layer of a silicon wafer, by deposition of droplets of a 11.2% (w/v) ammonium fluoride solution onto a 2.5 μm thick polyacrylic acid receptive layer maintained at a platen temperature of 45° C.

Using the method of the preferred arrangement, both hole and groove openings can be etched in silicon dioxide layers to a depth of at least 400 nm. FIG. 4 shows a Dektak profile of a groove etched in a silicon dioxide layer by depositing 50 layers of a deposition solution containing 11.2% (w/v) ammonium fluoride onto a PAA acidic polymer layer. The polymer layer was formed by spin-coating a solution comprising 25% (w/v) PAA with 0.6% (v/v) Novec 4200 over a 400 nm thick silicon dioxide layer thermally grown on a polished silicon wafer. The platen temperature was 45° C. and the pixels of the lines of the pattern were spaced 25 μm apart. Increasing the spacing between the deposited drops can result in slightly narrower grooves; however it is necessary to deposit more layers of the deposition solution. Spacing the drops more closely results in wider grooves, however fewer layers of the etching pattern are required to be printed to etch features of the same depth.

Figure 5:
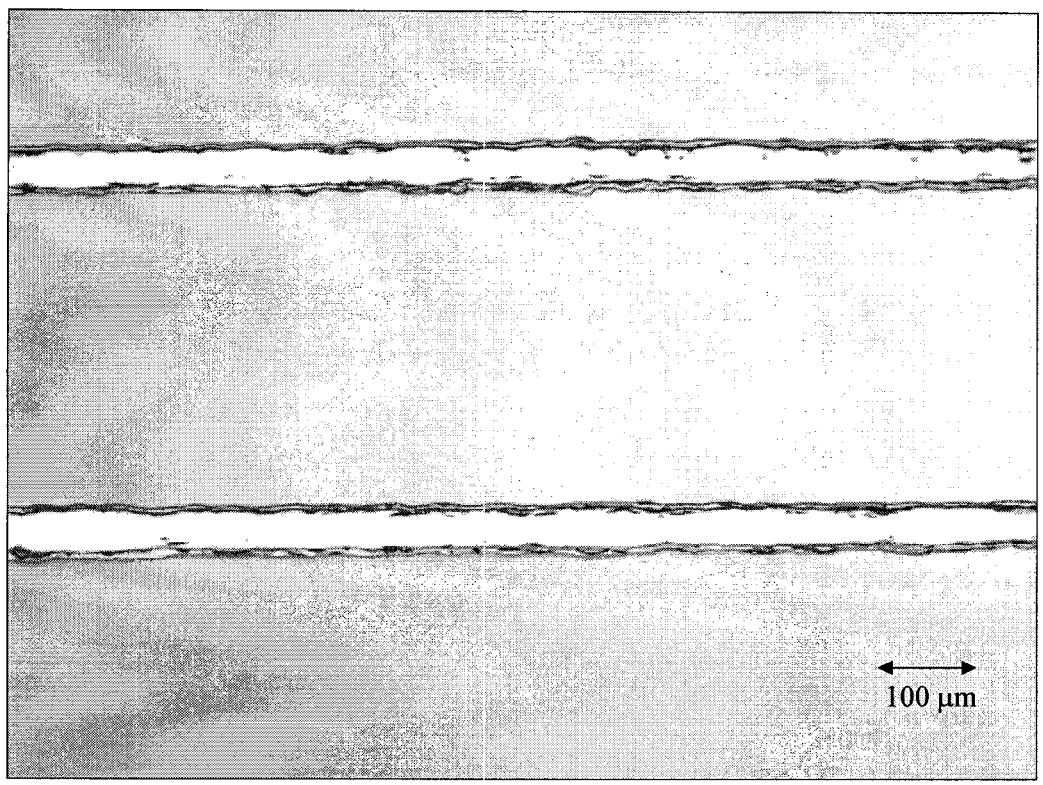
FIG. 5 is an optical image showing etched grooves from which the profile in FIG. 4 was obtained.

FIG. 5 is an optical image showing the etched grooves from which the profile in FIG. 4 was taken. The width of the grooves at the surface was 50-60 μm. Narrower grooves can be etched by using some of the variations that have been mentioned above (e.g., printing fewer layers of the deposition solution, increasing the drop spacing, decreasing the critical surface tension of the polymer film, increasing the platen temperature, etc.).

Figure 6:
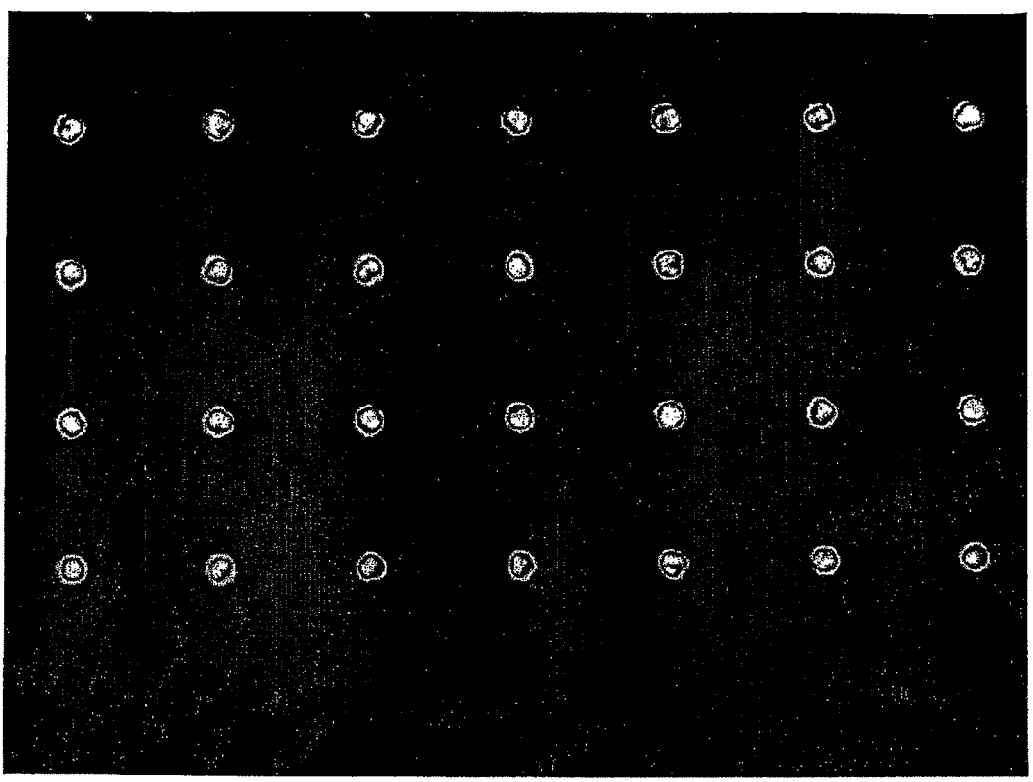
FIG. 6 is an optical image of an array of holes, etched in a thermally grown silicon dioxide layer of a silicon wafer, by deposition of droplets of a 11.2% (w/v) ammonium fluoride solution onto a 2.5 μm thick polyacrylic acid receptive layer maintained at a platen temperature of 45° C.
Figure 7:
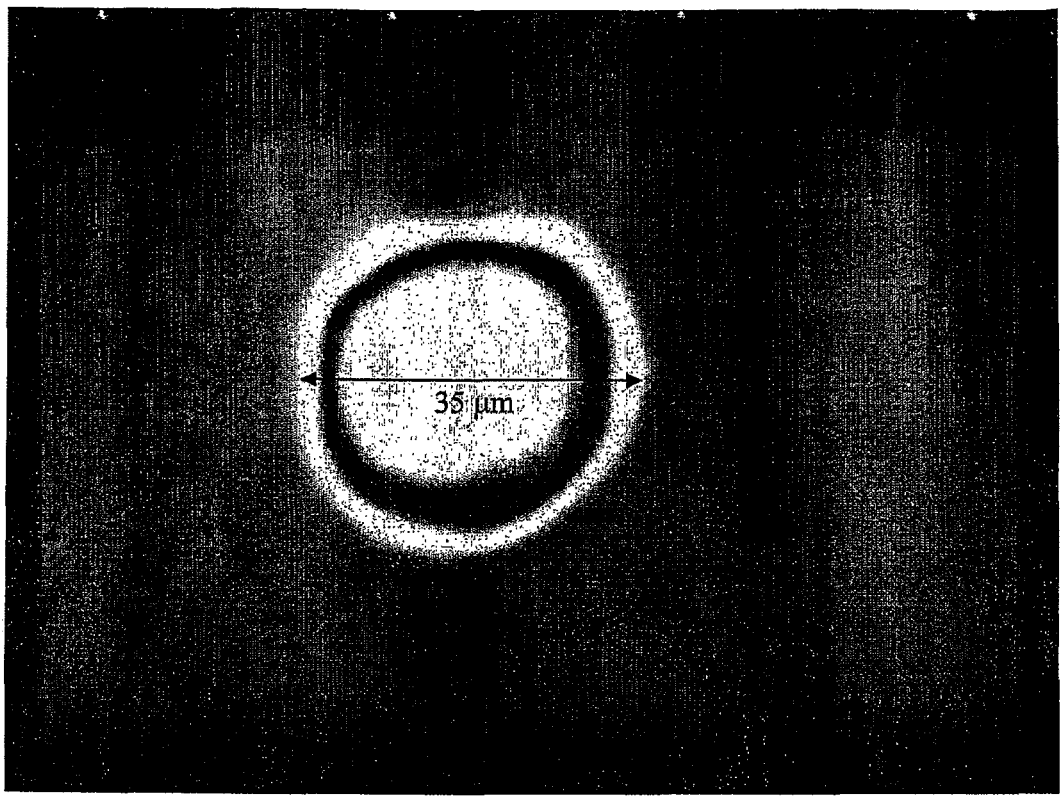
FIG. 7 is an optical image of a hole, taken from the sample of etched holes including the one depicted in FIG. 6.
Figure 8:
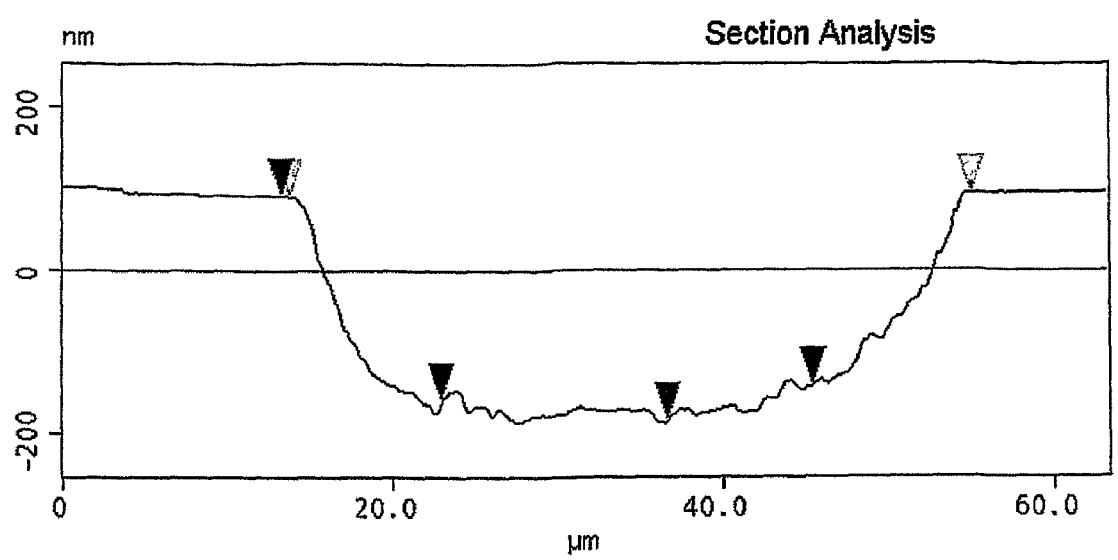
FIG. 8 is an AFM profile of an etched hole, taken from the sample of etched holes including the one depicted in FIG. 6.

FIG. 6 shows an array of holes, etched by the method of the preferred arrangement, in an ~290 nm silicon dioxide layer thermally grown on a polished silicon wafer. The holes were etched by printing 60 layers of a deposition solution containing 11.2% (w/v) ammonium fluoride onto a PAA acidic polymer layer. The polymer layer was formed by spin-coating a solution comprising 25% (w/v) PAA over a ~300 nm thick silicon dioxide layer thermally grown on a polished silicon wafer. The platen temperature was maintained at 45° C. while printing. FIG. 7 is an optical image of one of the holes depicted by FIG. 6. The outer diameter of the etched hole was ~35 μm. FIG. 8 shows an AFM profile of one of the holes depicted by FIG. 6.

Figure 9:
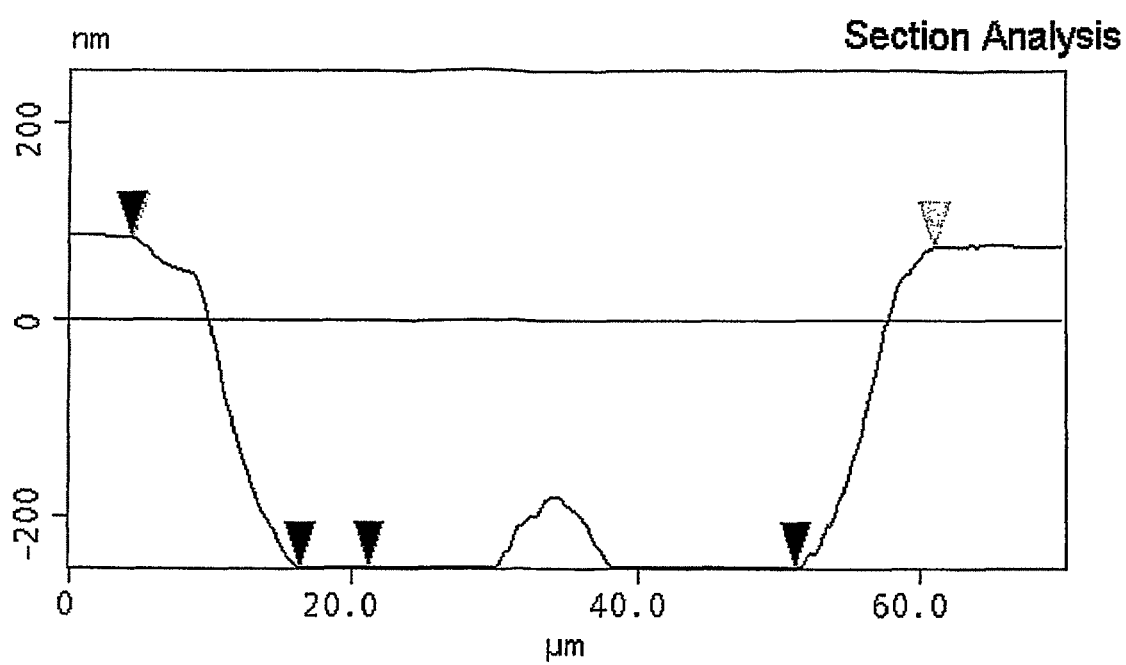
FIG. 9 is an AFM profile of a hole structure etched by deposition of droplets of a 14.4% (w/v) ammonium fluoride solution onto a 2.5 μm thick polyacrylic acid receptive layer maintained at a platen temperature of 55° C.

Groove and hole openings can be etched using deposition solutions which contain higher fluoride concentrations (e.g., 14-15% (w/v) ammonium fluoride). Although, the higher fluoride concentration results in a reduction of the number of layers to be deposited, the resulting groove width and/or hole diameters are larger. This occurs because the higher fluoride concentration results in more spreading of the droplets on contact with the surface polymer. In addition to increased spreading of the droplets, the PEG in the deposition solution tends to migrate to the periphery of the deposited droplet as solvent evaporates. The phenomenon is commonly known as the "coffee ring" effect. The PEG carries fluoride ions with it thus resulting in a higher concentration of fluoride ion at the periphery than in the centre of the deposited droplet. This effect can result in "donut" shaped openings rather than the round holes as shown in FIGS. 6 to 8. FIG. 9 shows an AFM profile of such an etched opening formed by printing 50 layers of a deposition solution containing 14.4% (w/v) ammonium fluoride onto a PAA acidic polymer layer. The polymer layer was formed by spin-coating a solution comprising 25% (w/v) PAA over a ~390 nm silicon dioxide layer thermally grown on a polished silicon wafer. Donut-shaped openings can be minimised by replacing the PEG 400 in the deposition fluid with lower glycols, such as propylene glycol.

Figure 10:
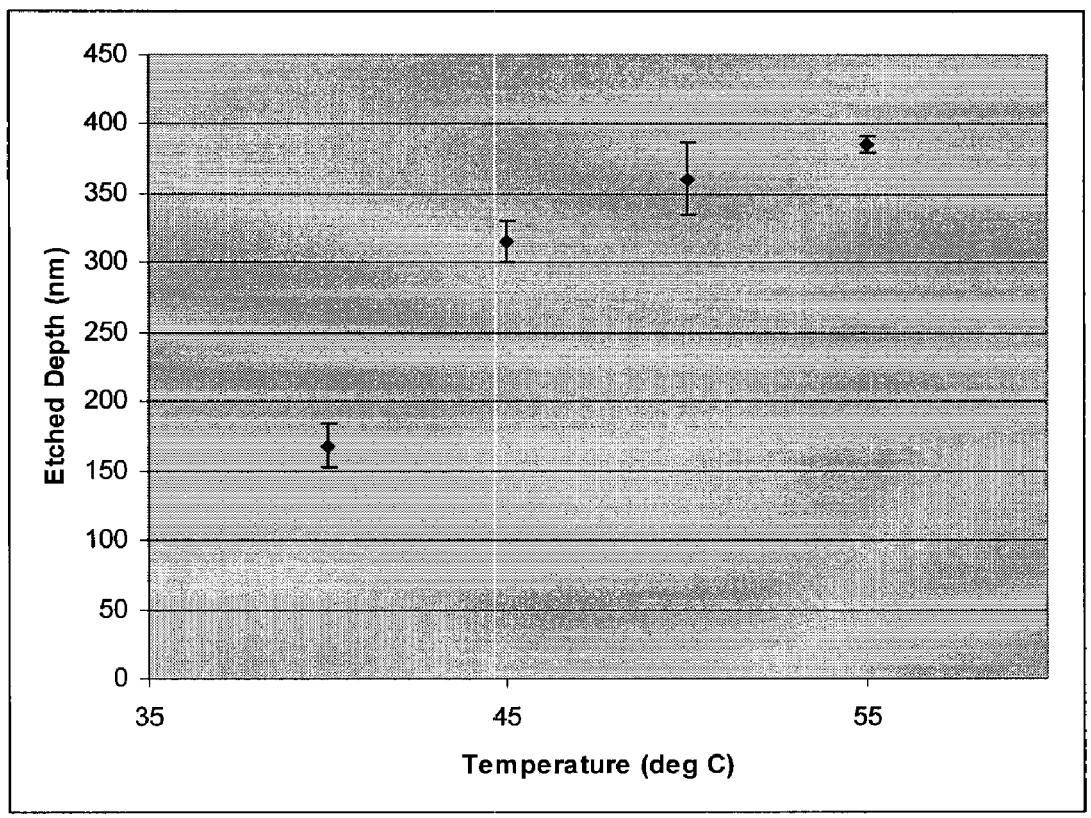
FIG. 10 is a graph showing the maximum etched depth of hole structures, etched by deposition of droplets of a 14.4% (w/v) ammonium fluoride solution onto a 2.5 μm thick polyacrylic acid receptive layer, as a function of platen temperature.

As mentioned previously, the platen temperature can also be varied to tune the method to particular requirements. Although, the preferred method of etching groove openings uses a platen temperature of 45° C., it can be advantageous to use higher platen temperatures to etch hole openings, in particular when thicker oxide layers are required to be etched. FIG. 10 is a graph which shows the maximum etched depth (of silicon dioxide) as a function of platen temperature. These results were obtained using a deposition solution containing 14.4% ammonium fluoride and a PAA acidic layer of ~2.5 μm thickness. The maximum etched depth of the resulting donut-shaped openings (as shown by FIG. 9) was measured from the respective AFM profiles.

Clearly, the specification of the actual etching parameters used by a process or application will depend on requirements such as feature size, oxide thickness required by the process, completeness of etch and waste disposal. Although, the addition of surfactants and other additives to either or both of the polymer and deposition solution can improve etching performance, their presence in the waste fluid of the process may be problematic. The etching method of the preferred arrangement does not require their use.

The method as described can be used to etch patterns of openings in oxide layers which have been grown or deposited on polished, planar or textured silicon wafers. Typically, for silicon wafer solar cell applications the surface of a wafer is textured using wet chemistry etching methods to reduce reflection from the front surface and in some cases, provide light trapping inside the cell.

Etched grooves and holes such as shown in FIG. 5 to 8 can be used to form metal contacts for silicon solar cells. In some cases, where the base of the grooves need a subsequent diffusion step, the oxide layer can be used as a diffusion mask to protect the non-groove surface from the dopant atoms during the diffusion process. In some cases, the oxide acts as an etch mask if etching of the underlying silicon is required. Depending on the conditions of the processes, an oxide layer of at least 300 nm thick may be required. As demonstrated, etching grooves and holes through such oxide layer using the method can be achieved.

Patterns of etched openings can also be used as a mask for either diffusing the underlying silicon or etching the underlying silicon for other semiconductor or MEMS devices. The silicon dioxide layer can either be retained as part of the device or sacrificial (i.e., removed after acting as a mask for a subsequent diffusion or etching process).

Figure 11:
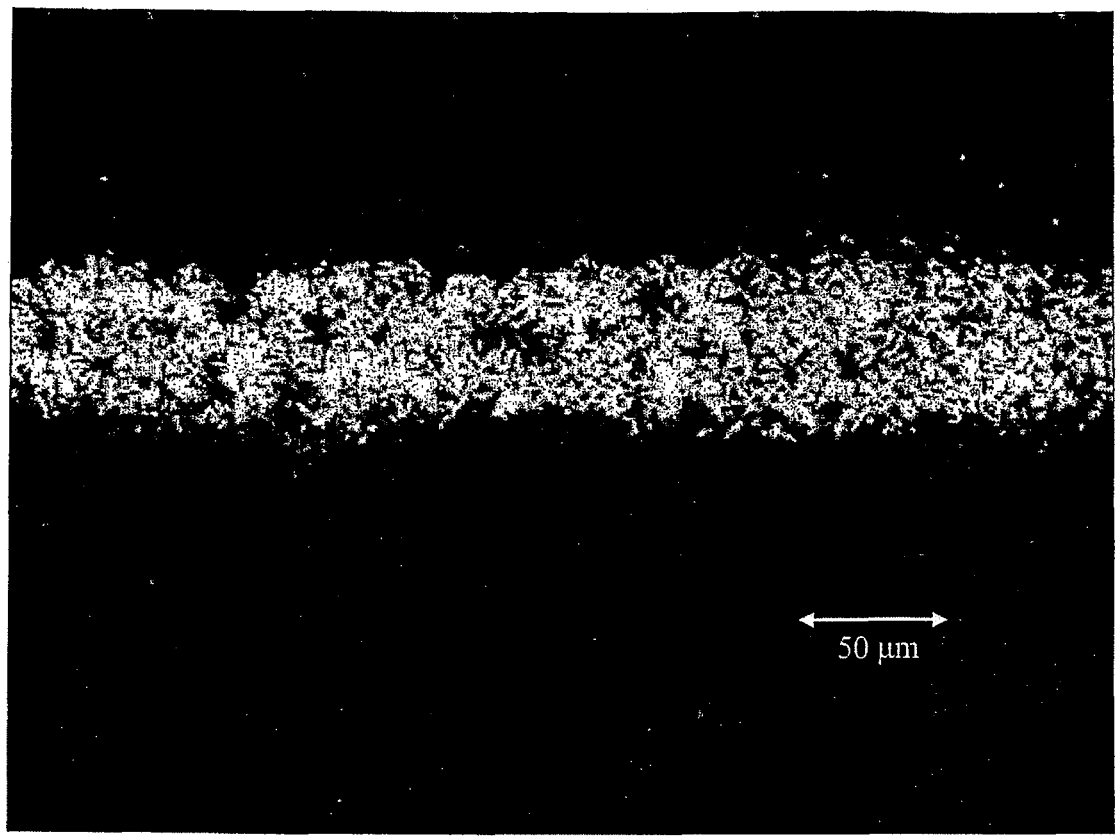
FIG. 11 is an optical image showing a groove etched in a 75 nm silicon nitride layer on a textured silicon surface.

Furthermore, the method as described can be used to etch openings in silicon nitride layers. In many cases, silicon nitride is the preferred passivation and antireflection layer used by silicon solar cells. FIG. 11 is an optical image which depicts a groove opening that has been etched in a 75 nm thick silicon nitride layer. The silicon nitride layer was deposited on a textured silicon wafer which was ~280 nm thick using Plasma Enhanced Chemical Vapour Deposition. The groove was etched in the silicon nitride by printing 50 layers of a deposition solution containing 11.2% ammonium fluoride onto a PAA surface layer of ~2.5 μm thickness which was formed over the silicon nitride layer. The spacing between the deposited drops in the printed lines was 25 μm.

In a further variation, more than one etching component can be deposited onto the surface layer. For example, regions of silicon can be etched by depositing, at substantially the same time, a source of fluoride (as described above for the etching of silicon dioxide) and an oxidising agent for the silicon (e.g., nitric acid or hydrogen peroxide). These two components can be deposited by separate inkjet printheads or jetting nozzles. Relative concentrations of the two components can be controlled by the deposition mechanism. For example, if the two components are being deposited by inkjet printing and the volume of oxidising agent required is five time as much as the volume of fluoride source, then it is possible to deposit five times more layers of the oxidising agent than the fluoride source. The sequence in which the individual layers are deposited can also be controlled. For example, early in the reaction it may be beneficial to deposit more of the oxidising agent than the fluoride source. With alternative deposition methods, where fluids are deposited in continuous stream, the desired volume ratios of the two components can be controlled by varying the rate at which the nozzle moves over the surface being treated.

The surface layer can be an essential chemical component for the etching reaction (as described for the preferred arrangement where silicon dioxide is etched) or it can either act as a physical framework or contain additives required for the processing reaction. In the above variation, in which silicon is etched, the role of the surface layer is to provide a porous framework which minimises the spread of the deposited fluids. Without the surface layer, the deposited fluids can spread to a large extent over the surface, resulting in larger etched features. Alternatively, the surface layer can be used to supply additives (e.g., surfactants, catalysts, enzymes, reducing agents, oxidising agents) for the processing reaction. For example, as described earlier in this description, surfactants can be included in the surface layer. Catalysts and enzymes can be added in a similar way, with their effective concentrations being able to be controlled by the concentration of the additive in the solution used to form the surface layer.

The ability to employ a surface layer as either an essential chemical component (e.g., acid source) or as a physical framework may also be applied to the etching of other dielectrics, semiconductors, and metals (e.g., aluminium, copper and chromium) which are routinely used in semiconductor fabrication processes.

In a final variation, the surface layer can be omitted and both the first and second components for processing the surface can be applied directly to the surface to be processed. For example, silicon can be directly etched as described previously but without the requirement for a surface layer. In this variation, it can be advantageous to limit the spreading of the deposited solutions using surface treatments. For example, silicon surfaces can be pre-treated with hydrogen fluoride or ammonium fluoride solutions to remove any native oxide layer that would render the surface hydrophilic. Alternatively, physical barriers can be used to reduce the spreading of the deposited fluids. For example, a mask can first be etched in a silicon dioxide layer, using the preferred arrangement described above, then a source of fluoride (e.g., ammonium fluoride) and an oxidising agent for the silicon (e.g., nitric acid or hydrogen peroxide) can be deposited into the openings (grooves or holes) in the oxide. In this arrangement, it is necessary to limit the concentration of the fluoride ion at the site of etching to ensure that the oxide mask is not extensively etched in the process.

It should be clear that all the abovementioned arrangements of the invention enable a process, such as etching, to be achieved by bringing together at least two necessary components for the process at just the locations on the surface to be processed. For processes such as etching, this approach is advantageous because toxic or corrosive chemical compounds are only generated at the location to be processed. This is desirable because of (i) the increased safety of the process for human operators; (ii) reduced chemical usage; and (iii) reduced chemical waste. Furthermore, since the individual components of the processing reaction are typically more easily handled (i.e., are less chemically active) than the active etchant or modifier, the approach enables the use of patterned deposition techniques such as inkjet printing. The corrosive chemicals typically used for the etching of metals, dielectrics and semiconductors are difficult to deposit in a pattern-wise manner because they corrode components of the fluid path in the devices.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention is further described by the following numbered paragraphs:

1. A method of processing a surface, wherein the process is restricted to an area of the surface defined by a predetermined pattern, the method comprising:
(a) providing at least a first component required for the processing of the surface as a layer extending over a region of the surface to be processed which at least covers an area of the predetermined pattern;
(b) providing at least one deposition composition comprising one or more further components required for the processing of the surface; and
(c) applying the at least one deposition composition over the region to be processed according to the predetermined pattern;
whereby the first component required for processing the surface acts with the one or more further components required for processing of the surface to process the surface only in the area of the predetermined pattern.

2. The method of paragraph 1 wherein the layer comprising the first component, extending over the region of the surface to be processed is in a gas phase.

3. The method of paragraph 1 wherein the layer comprising the first component, extending over the region of the surface to be processed is in a liquid phase.

4. The method of paragraph 2 or 3 wherein a porous material is applied to the surface to be processed and the first component required for the processing of the surface is constrained within the porous layer.

5. The method of paragraph 1 wherein the layer comprising the first component, extending over the region of the surface to be processed is a gel or solid layer.

6. The method of paragraph 5 wherein the layer comprising the first component, extending over the region of the surface to be processed is applied by applying a solution containing the first component and evaporating a solvent of the solution to deposit the first component on the surface.

7. The method of paragraph 6 wherein the method of applying the solution containing the first component comprises a flow-on method, a spin-on method, a spray coating method or an inkjet printing method.

8. The method of paragraph 6 wherein the solution containing the first component also contains an additive which enhances or catalyses the processing of the surface.

9. The method of paragraph 8 wherein the additive acts as a surfactant during the processing of the surface.

10. The method of paragraph 8 wherein the additive reduces the critical surface tension of the surface layer.

11. The method of paragraph 5 or 6 wherein the layer comprising the first component, extending over the region of the surface to be processed is applied by flowing the first component over the region of the surface to be processed at elevated temperature to form a layer and hardening the layer by cooling.

12. The method as described in any one of the preceding paragraphs wherein the process material created by the mixture of the first and the one or more further components has a physical characteristic making it difficult to handle (such as being highly corrosive, toxic viscous, or sticky) and the one or more further components do not exhibit the respective characteristic or exhibit the characteristic to a lesser degree.

13. The method of any one of paragraphs 1-12 wherein the surface is processed by etching according to the predetermined pattern.

14. The method of any one of paragraphs 1-12 wherein the surface is processed by applying a layer of material in the predetermined pattern.

15. The method of any one of paragraphs 1-12 wherein the surface is processed by altering the nature of the surface in the predetermined pattern.

16. The method of processing a surface as described in paragraph 13, the surface being a surface of a predetermined material and the etching of the surface being according to the predetermined pattern, the method comprising:
(a) forming the surface layer over the predetermined material, the surface layer comprising at least a first component required for etching the predetermined material;
(b) providing at least one deposition composition comprising one or more further components required for etching the predetermined material; and
(c) applying the at least one deposition composition to the surface layer according to the predetermined pattern,
whereby the surface layer comprising the first component acts with the one or more further components to etch the region of the predetermined material to be processed according to the predetermined pattern.

17. The method of paragraph 16 wherein predetermined material is selected from the group comprising dielectrics such as silicon dioxide, silicon nitride, silicon carbide, TCOs, glass, organic resins and other polymers including pattern mask materials, metals such as aluminium, copper, silver, gold, tin and lead or alloys thereof and semiconductor materials including silicon, germanium, gallium-arsenide, indium phosphide, or alloys such as silicon-germanium or aluminium-gallium-arsenid, indium-selenide, galium-selenide, Cadmium-telluride or Copper indium gallium selenide (CIGS).

18. The method of paragraph 16 wherein the surface layer contains a polymer layer.

19. The method of paragraph 18 wherein the polymer layer is acidic.

20. The method of paragraph 16 wherein the surface layer is water-soluble.

21. The method of paragraph 16 wherein the surface layer contains one of polyacrylic acid, polystyrene sulphate, an acidic polythiophene derivative, an acidic polyaniline derivative, or a water soluble phenolic resin.

22. The method of paragraph 16 wherein the deposition composition contains a source of fluoride ions.

23. The method of paragraph 22 wherein the source of fluoride ions is provided by one or more of: ammonium fluoride, a tetra alkyl ammonium fluoride, sodium fluoride, and lithium fluoride.

24. The method as described in paragraphs 13 or 16 wherein said etching results in openings in a dielectric layer of a silicon solar cell device.

25. The method of paragraph 24 wherein said openings are used to form metal contacts to said silicon solar cell device.

26. The method as described in any one of paragraphs 1 to 25 including a final step comprising:
washing the surface to remove any part of the layer comprising the first component remaining outside the predetermined pattern and any unwanted processing products.

27. A method of etching a surface, the surface being a surface of a predetermined material and the etching of the surface being according to a predetermined pattern, the method comprising:
(a) providing a first deposition composition comprising one or more components required for the etching of the predetermined material;
(b) providing a second deposition composition comprising at least a further component required for the etching of the predetermined material; and
(c) applying the said first and second deposition composition over the region to be etched according to the predetermined pattern;
whereby the one or more components of the first deposition composition act with the one or more components of the second deposition composition to etch a region of the predetermined material a according to the predetermined pattern.

28. The method of paragraphs 16 and 27 wherein a component of a deposition composition comprises an oxidising agent for the predetermined material to be etched.

29. The method of paragraph 28 wherein the oxidising agent is one of nitric acid and hydrogen peroxide.

30. The method of paragraph 1 or 16 wherein the predetermined material is silicon.

31. The method as described in any one of the preceding paragraphs wherein a deposition composition is delivered in drop-wise manner.

32. The method of paragraph 31 wherein droplets of a deposition composition are applied using an inkjet printing device.

33. The method as described in any one of the preceding paragraphs wherein a deposition composition is delivered as a continuous fluid stream.

34. The method of paragraph 33 wherein the stream is generated by a device which is one of: an electrohydrodynamic printing device; a continuous inkjet printing device or an aerosol jet printing device.

Having thus described in detail embodiments of the present invention, it is to be understood that the invention defined by the above paragraphs is not to be limited to particular details set forth in the above description as many apparent variations thereof are possible without departing from the spirit or scope of the present invention.

What is claimed is:

1. A method of etching a material, wherein the etching is restricted to an etch pattern area on an unmasked exposed surface of the material, the etch pattern area extending over only a part of the unmasked exposed surface, the method comprising:
   (a) providing at least a first component required for the etching of the material as a surface layer extending over a region of the unmasked exposed surface of the material, the surface layer being a gel or solid layer covering at least the etch pattern area;
   (b) providing at least one deposition composition comprising one or more further components required for the etching of the material; and
   (c) applying the at least one deposition composition over the region of the unmasked exposed surface of the material in a pattern corresponding to the etch pattern area;
   whereby the first component required for etching the material reacts with the one or more further components required for etching of the material to form an etchant to etch the material only in the etch pattern area.

2. The method of claim 1 wherein the layer comprising the first component, extending over the region of the unmasked exposed surface of the material is applied by applying a solution containing the first component and evaporating a solvent of the solution to deposit the first component on the unmasked exposed surface.

3. The method of claim 2 wherein the method of applying the solution containing the first component comprises a flow-on method, a spin-on method, a spray coating method or a printing method.

4. The method of claim 2 wherein the solution containing the first component also contains an additive which enhances or catalyses the etching of the material.

5. The method of claim 4 wherein the additive acts as a surfactant during the etching of the material.

6. The method of claim 4 wherein the additive reduces the critical surface tension of the surface layer.

7. The method as claimed in claim 1 wherein an etchant created by the mixture of the first and the one or more further components has a physical characteristic making it difficult to handle and the one or more further components do not exhibit the respective characteristic or exhibit the characteristic to a lesser degree than the etchant created by the mixture of the first component and the one or more further components.

8. The method of claim 1 wherein the material is selected from the group consisting of silicon dioxide, silicon nitride, silicon carbide, TCOs, glass, organic resins, pattern mask materials, aluminium, copper, silver, gold, tin and lead or alloys thereof, silicon, germanium, gallium-arsenide, indium phosphide, silicon-germanium, aluminium-gallium-arsenid, indium-selenide, galium-selenide, Cadmium-telluride and Copper indium gallium selenide (CIGS).

9. The method of claim 1 wherein the surface layer comprises a polymer layer.

10. The method of claim 1 wherein the surface layer is water-soluble.

11. The method of claim 1 wherein the surface layer comprises polyacrylic acid, polystyrene sulphate, an acidic polythiophene derivative, an acidic polyaniline derivative, or a water soluble phenolic resin.

12. The method of claim 1 wherein the deposition composition contains a source of fluoride ions.

13. The method of claim 12 wherein the source of fluoride ions is provided by one or more of: ammonium fluoride, a tetra alkyl ammonium fluoride, sodium fluoride, and lithium fluoride.

14. The method as claimed in claim 1 wherein the material comprises a dielectric layer of a silicon solar cell device and the etching of the dielectric layer results in openings in the dielectric layer.

15. The method as claimed in claim 1 including a final step comprising: washing the unmasked exposed surface of the material, after it is etched, to remove any part of the layer comprising the first component remaining outside the etch pattern area and any unwanted processing products.

16. The method as claimed in claim 1 wherein the at least one deposition composition is delivered in drop-wise manner.

17. The method of claim 16 wherein droplets of the at least one deposition composition are applied using a printing device.

18. The method as claimed in claim 1 wherein the at least one deposition composition is delivered as a continuous fluid stream.

19. The method of claim 18 wherein the stream is generated by a device which is one of: an electrohydrodynamic printing device; a continuous inkjet printing device or an aerosol jet printing device.

20. A method of etching an unmasked exposed uniform surface of a material layer, wherein the etching is restricted to an etch pattern area on the unmasked exposed uniform surface, the etch pattern area extending over only a part of the unmasked exposed uniform surface, the method comprising:

(a) providing at least a first component required for the etching of the material layer as a surface layer extending over a region of the unmasked exposed uniform surface of the material layer to be etched, the surface layer covering at least the etch pattern area and the surface layer being applied using one of a flow-on method, a spin-on method, a spray coating method or a printing method;

(b) providing at least one deposition composition comprising one or more further components required for the etching of the material layer; and (c) applying the at least one deposition composition over the region of the unmasked exposed uniform surface to be etched in a pattern corresponding to the etch pattern area;

whereby the first component required for etching the material layer reacts with the one or more further components required for etching of the material layer to form an etchant to etch the material layer only in the etch pattern area.

* * * * *